US00RE47892E

(19) United States
(12) Reissued Patent
Hsieh

(10) Patent Number: US RE47,892 E
(45) Date of Reissued Patent: Mar. 3, 2020

(54) SEMICONDUCTOR LIGHT EMITTING DEVICE

(71) Applicant: Epistar Corporation, Hsinchu (TW)

(72) Inventor: Min-Hsun Hsieh, Hsinchu (TW)

(73) Assignee: EPISTAR CORPORATION, Hsinchu (TW)

(21) Appl. No.: 14/151,887

(22) Filed: Jan. 10, 2014

Related U.S. Patent Documents

Reissue of:
(64) Patent No.: 8,148,196
Issued: Jan. 3, 2012
Appl. No.: 12/984,184
Filed: Jan. 4, 2011

U.S. Applications:
(63) Continuation of application No. 12/155,595, filed on Jun. 6, 2008, now Pat. No. 7,884,380.

(30) Foreign Application Priority Data

Jun. 6, 2007 (TW) ..... 96120457

(51) Int. Cl.
*H01L 33/60* (2010.01)
*H01L 33/58* (2010.01)
*H01L 33/54* (2010.01)

(52) U.S. Cl.
CPC ..... *H01L 33/58* (2013.01); *H01L 33/54* (2013.01); *H01L 2933/0091* (2013.01)

(58) Field of Classification Search
CPC ... Y02E 10/50; H01L 31/105; H01L 31/1804; H01L 31/022425; H01L 33/32; H01L 25/0753; H01L 33/62; H01L 27/153
USPC ..... 438/98; 257/88, 94, 458, E33.072
See application file for complete search history.

(56) References Cited

U.S. PATENT DOCUMENTS

| | | | | |
|---|---|---|---|---|
| 6,661,030 | B2 * | 12/2003 | Komoto et al. | 257/98 |
| 6,744,074 | B2 | 6/2004 | Horie et al. | |
| 7,009,213 | B2 | 3/2006 | Camras et al. | |
| 7,732,234 | B2 * | 6/2010 | Greisen et al. | 438/29 |
| 7,943,953 | B2 * | 5/2011 | Sakamoto | H01L 33/54 257/100 |
| 2002/0014674 | A1 | 2/2002 | Hideyoshi et al. | |
| 2006/0131602 | A1 * | 6/2006 | Ouderkirk | H01L 33/642 257/100 |
| 2006/0163592 | A1 | 7/2006 | Tsai et al. | |
| 2006/0163599 | A1 | 7/2006 | Tsai et al. | |
| 2008/0083973 | A1 * | 4/2008 | Yamada et al. | 257/676 |

(Continued)

FOREIGN PATENT DOCUMENTS

| | | |
|---|---|---|
| JP | 55-70080 A | 5/1980 |
| JP | 6-166213 A | 6/1994 |
| JP | 7-38153- | 2/1995 |

(Continued)

*Primary Examiner* — Tuan H Nguyen
(74) *Attorney, Agent, or Firm* — Ditthavong & Steiner, P.C.

(57) ABSTRACT

This invention discloses a light emitting semiconductor device including a light-emitting structure and an external optical element. The optical element couples to the light-emitting structure circumferentially. In addition, the refractive index of the external optical element is greater than or about the same as that of a transparent substrate of the light-emitting structure, or in-between that of the transparent substrate and the encapsulant material.

19 Claims, 22 Drawing Sheets

300

(56) References Cited

U.S. PATENT DOCUMENTS

2008/0315232 A1 12/2008 Matsuo et al.

FOREIGN PATENT DOCUMENTS

JP 2005-123588 A 5/2005
JP 2006-310887 A 11/2006

* cited by examiner

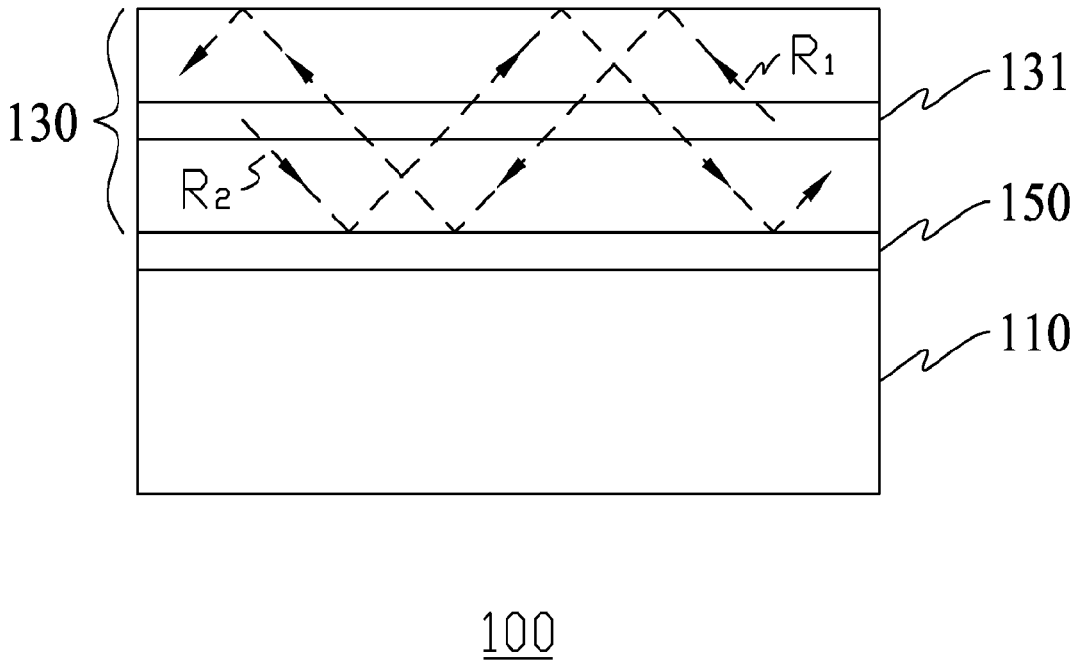
FIG. 1A(Conventional LED)

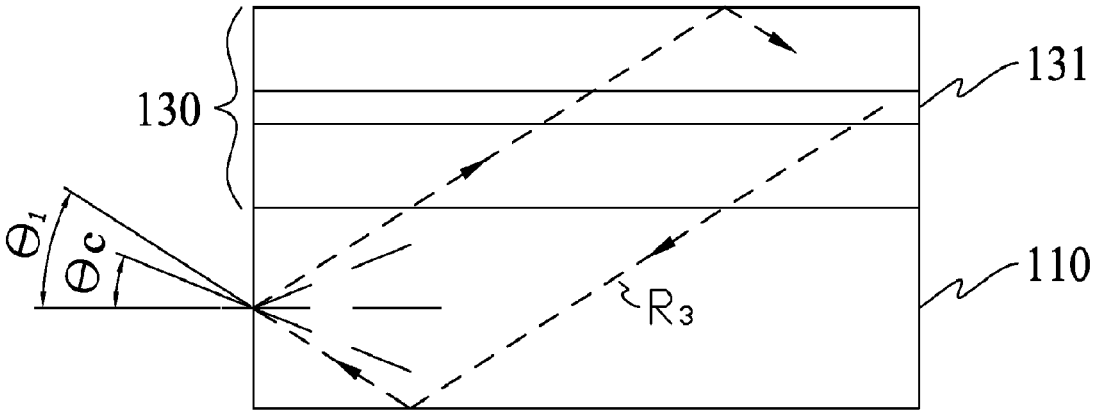
100
FIG. 1B(Conventional LED)

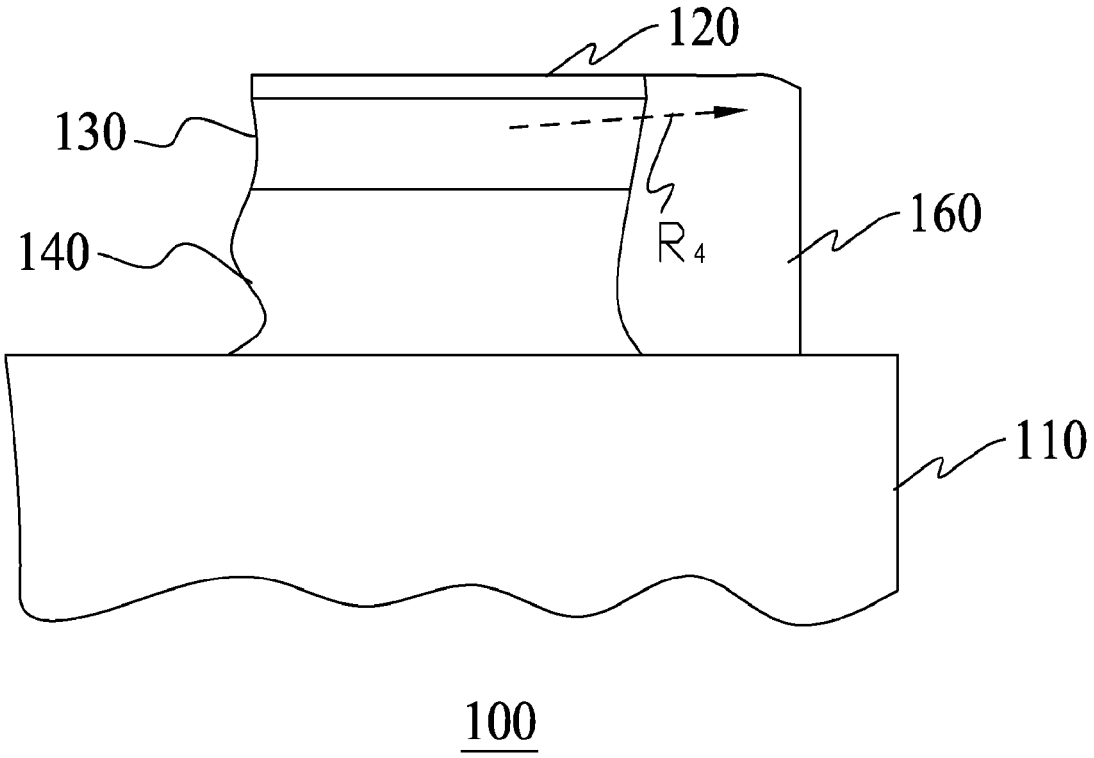
FIG. 1C(Conventional LED)

200

200

300

300

300

SEMICONDUCTOR LIGHT EMITTING DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

REFERENCE TO RELATED APPLICATION

This application is a Continuation Application of U.S. application Ser. No. 12/155,595 filed on Jun. 6, 2008, which claims the right of priority based on Taiwan Application Serial Number 096120457, filed on Jun. 6, 2007, the disclosure of which is incorporated herein by reference in its entirety.

TECHNICAL FIELD

The present disclosure relates to a semiconductor light-emitting device, and more particularly, to a semiconductor light-emitting device including an external optical element. The refractive index of the external optical element is larger than or about the same as that of a transparent substrate of a light-emitting structure, or in-between that of the transparent substrate and an encapsulant.

BACKGROUND

A light emitting diode (LED) is a solid-state semiconductor element including at least a p-n junction. The p-n junction is formed between a p-type and an n-type semiconductor layers. When the p-n junction receives a suitable forward voltage, the holes of the p-type semiconductor layer and the electrons of the n-type semiconductor layer are combined to emit light. Generally, the region emitting light is called a light-emitting region.

The light emitted from the light-emitting region is forwarded omni-directionally. However, a user usually needs only the light forwarding to a specific direction. Consequently, a reflective layer or a mirror for reflecting a portion of the light is adopted. Besides, the difference of the refractive indices between the LED's material and environmental medium can result in total reflection of the light emitting to the boundary of the LED in a specific incident angle. In general, it is unavoidable for each kind of the reflective light mentioned above to travel through inside the LED.

Referring to FIG. 1A, a known LED 100 includes a substrate 110 and an epitaxy layer 130. The epitaxy layer 130 includes an active layer 131 which can emit light omni-directionally when receiving a forward voltage. A reflective layer 150 is formed between the epitaxy layer 130 and the substrate 110 to reflect the light from the active layer 131.

A first ray R1 emits to the upside of the LED 100. When the refractive index of the environmental medium is less than that of the LED 100 and the incident angle is larger than the critical angle, the first ray R1 can be reflected totally at the boundary of the LED 100 and then return to the inside thereof. When the first ray R1 passes the active layer 131, a portion of the first ray R1 is absorbed by the active layer 131, and the other portion of the first ray R1 that is not absorbed emits to the reflective layer 150 and is reflected upward to pass the active layer 131 again. Thus, the first ray R1 resonates in the epitaxy layer 130, passes the active layer 131 repetitiously, and then is absorbed gradually. Under the similar mechanism, a second ray R2 emitting to the downside of the LED 100 also resonates in the epitaxy layer 130, passes the active layer 131 repetitiously, and then is absorbed gradually.

Referring to FIG. 1B, it shows no reflective layer is formed between the substrate 110 and the epitaxy layer 130 of the LED 100, and the substrate 110 is transparent relative to the light emitted from the active layer 131. The downside of the substrate 110 can attach to a mirror (not shown here) or air only. If a third ray R3 reflected from the bottom of the substrate 110 emits to the lateral wall of the substrate 110 with an incident angle $\theta_I$ larger than a critical angle $\theta_C$, it can be reflected into the epitaxy layer 130 and be absorbed by the active layer 131. As mentioned above, the third ray R3 could be reflected totally at the boundary of the epitaxy layer 130 and then return to the inside thereof. Moreover, it could resonate in the epitaxy layer 130, pass the active 131 repetitiously, and then be absorbed thereby. The light absorption in the active layer 131 reduces the light extraction efficiency of the LED 100 to some extent. Especially for small chip like 8 mil or 10 mil which has larger area ratio occupied by the pad, light can be reflected by the pad more easily and has higher proportion to be propagated inside the chip. Thus, a lot of light is absorbed by the epitaxy layer 130 when passing there or by the pad. The light extraction efficiency is reduced obviously.

Referring to FIG. 1C, LED includes a GaAs substrate 140 mounted on a transparent substrate 110, an epitaxy layer 130 located on the GaAs substrate 140, and a scattering mask 120 located on the epitaxy layer 130. A forth ray R4 from the epitaxy layer 130 emits sideward through a transparent resin 160. Because the thermal resistance of the transparent substrate 110 is usually higher, it is difficult for an LED to dissipate the heat.

In the aspect of the application of LED, for example, a back light unit (BLU) which is one of the main components of liquid crystal display (LCD) needs a light source with the characteristics of high brightness, low power consumption, thinness, and lightness. Beside the conventional Electro luminescence (EL), cold cathode fluorescent lamp (CCFL) and hot cathode fluorescent lamp (HCFL), LED is also one of the point light sources employed by the BLU.

SUMMARY OF THE DISCLOSURE

This disclosure provides a semiconductor light-emitting device and an encapsulant structure for reducing the light absorbed by the semiconductor stack.

This semiconductor light-emitting device includes a light-emitting structure and an external optical element. The light-emitting structure includes a semiconductor stack and a transparent substrate. The external optical element is connected to the periphery of the light-emitting structure, and the refractive index of the external optical element is larger than or about the same as that of the transparent substrate, or in-between that of the transparent substrate and encapsulant. The light-emitting structure receiving a forward voltage can emit light, and a portion of the light passes the transparent substrate and emits into the external optical element. The external optical element can increase the light extraction efficiency of the light-emitting structure. The bottom of the light-emitting structure contacts with the environmental medium or the heat dissipation material for increasing thermal efficiency by thermal convection and thermal conduction. In addition, this semiconductor light-emitting device is especially suitable for a semiconductor light-emitting structure having a p-type and/or an n-type light-impermissible pad occupying more than 50% of the surface area of the light-emitting structure.

This disclosure disclosed an encapsulant structure including at least an external optical element and a submount that is especially suitable to a light-emitting structure. The external optical element is mounted on the submount. A reflective layer can be set between the external optical element and the submount optionally.

BRIEF DESCRIPTION OF THE DRAWINGS

FIGS. 1~1C show a schematic diagram of a light path in a conventional LED.

DETAILED DESCRIPTION OF THE PREFERRED EMBODIMENTS

Figure 2A:
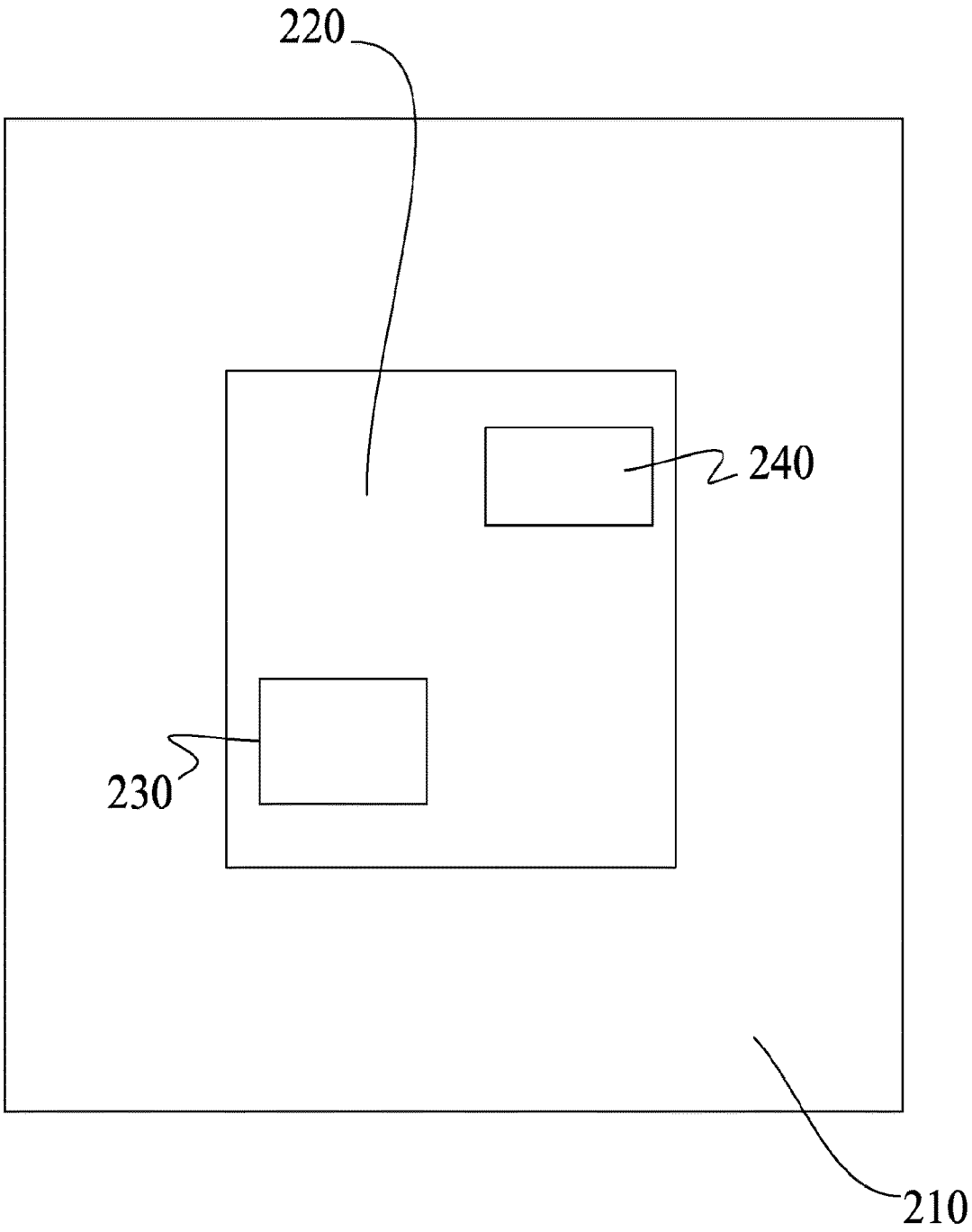
FIG. 2A shows a schematic diagram of a semiconductor light-emitting device in accordance with an embodiment.
Figure 2B:
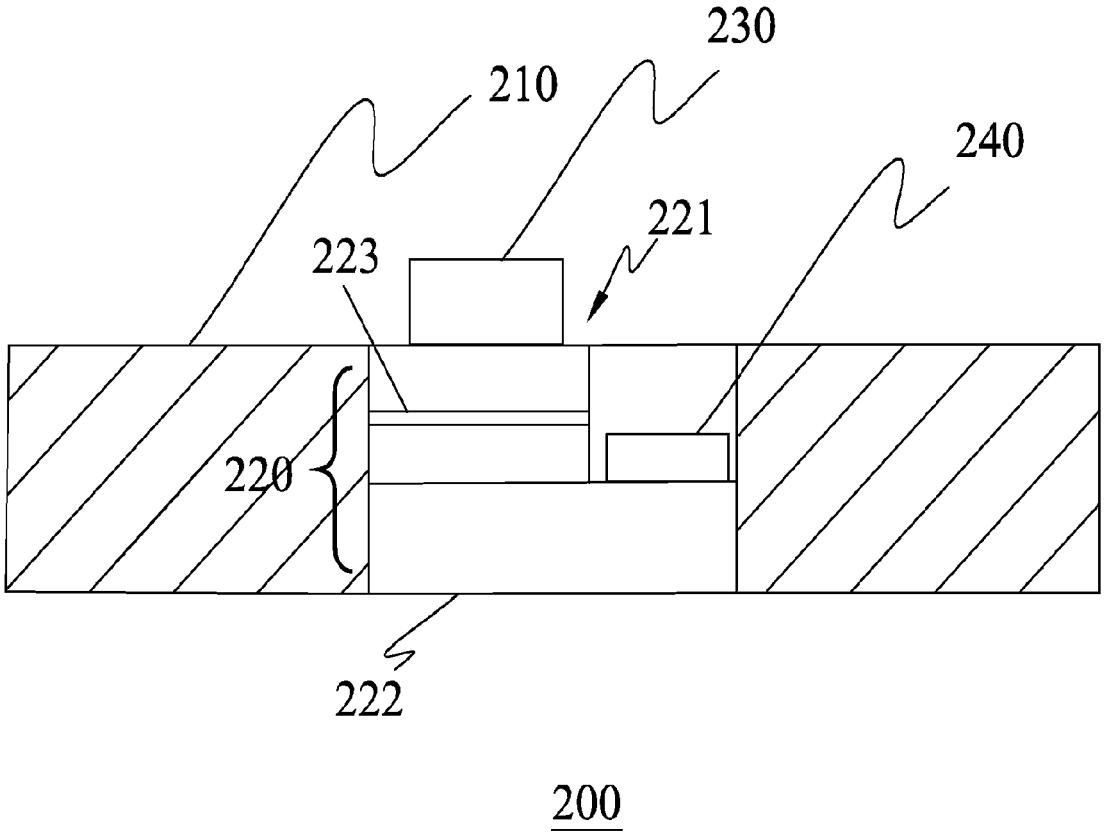
FIG. 2B shows a sectional diagram of the semiconductor light-emitting device of FIG. 2A.

Referring to FIGS. 2A-2B, a semiconductor light-emitting device 200 includes an external optical element 210 and a light-emitting structure 220. The light-emitting structure 220 such as an LED chip includes a semiconductor stack 221 and a transparent substrate 222, wherein the semiconductor stack 221 includes an active layer 223. When a forward voltage is applied to the light-emitting structure 220, the active layer 223 emits light. The external optical element 210 surrounds the light-emitting structure 220, connects thereto by its inner wall, and exposes at least a portion of a top surface or a bottom surface of the light-emitting structure 220. The bottom of the light-emitting structure 220 contacts with the environmental medium or a heat dissipation material (not shown here) for improving heat dissipation by thermal convection and thermal conduction. The external optical element 210 can be formed simultaneously during the manufacturing process of the light-emitting structure 220 or independently from that. For example, after the external optical element 210 is formed independently, it is attached to the light-emitting structure 220.

The material of the active layer 223 includes but unrestricted to the III-V group, the II-VI group, the IV group of the semiconductor, or the combination thereof, such as AlGaInP, MN, GaN, AlGaN, InGaN, AlInGaN, or CdZnSe. The refractive index of the external optical element 210 $n_o$ is larger than or about the same as the refractive index of the transparent substrate 222 $n_s$, or in-between that of the transparent substrate 222 $n_s$ and the encapsulant material $n_e$. Thus, it is more probability that the light passes the transparent substrate 222 and emits out from the external optical element 210. The light reflected to the semiconductor stack 221 is reduced relatively. Namely, the amount of the light absorbed by the semiconductor stack 221 is reduced.

Figure 2C:
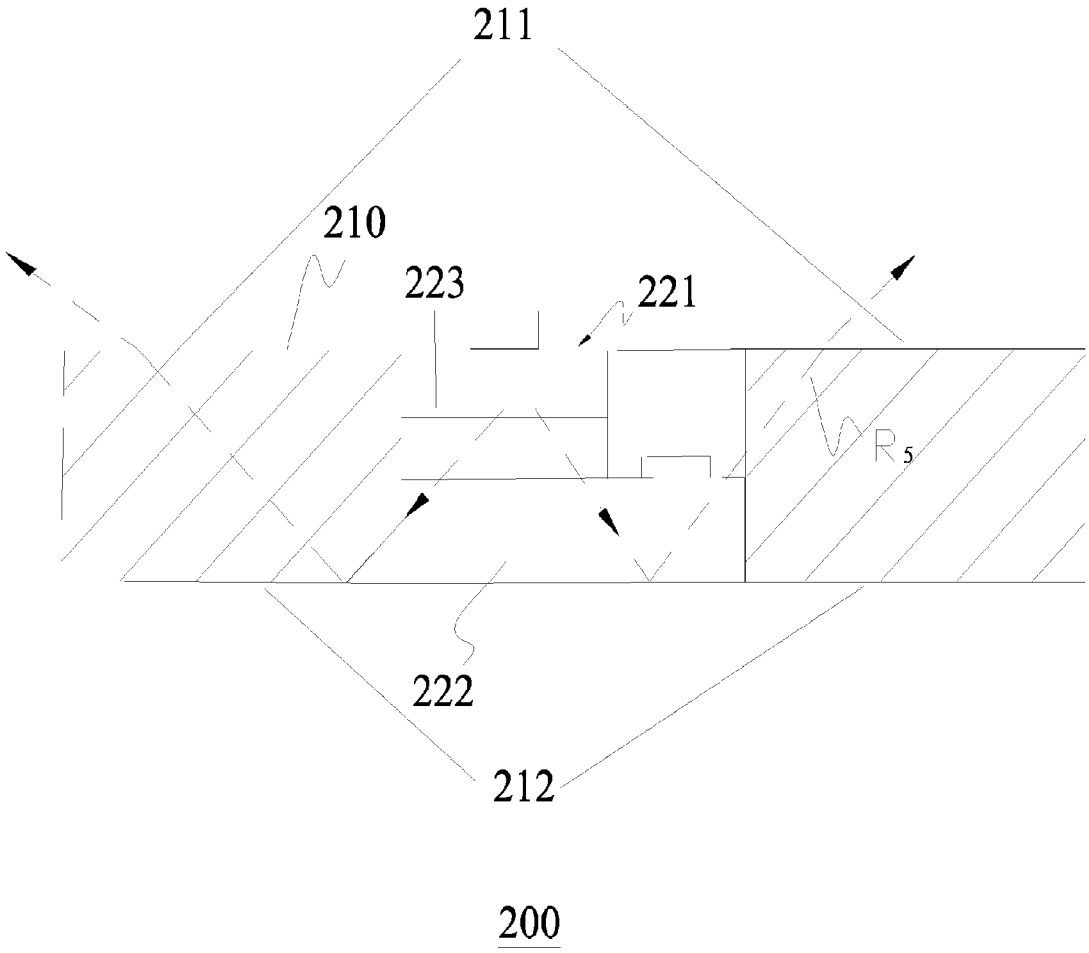
FIG. 2C shows a schematic diagram of a light path of the semiconductor light-emitting device of FIG. 2A.

Referring to FIG. 2C, a fifth ray $R_5$ emits to the bottom of the transparent substrate 222 from the active layer 223 and then is reflected to the external optical element 210. Because the refractive index of the external optical element 210 $n_o$ is larger than or about the same as the refractive index of the transparent substrate 222 $n_s$, the fifth ray $R_5$ is hard to be reflected to the semiconductor stack 221 as conventional technology. Thus, there is more probability for the fifth ray $R_5$ to enter the external optical element 210 and less probability to be absorbed by the semiconductor stack 221.

Figure 2D:
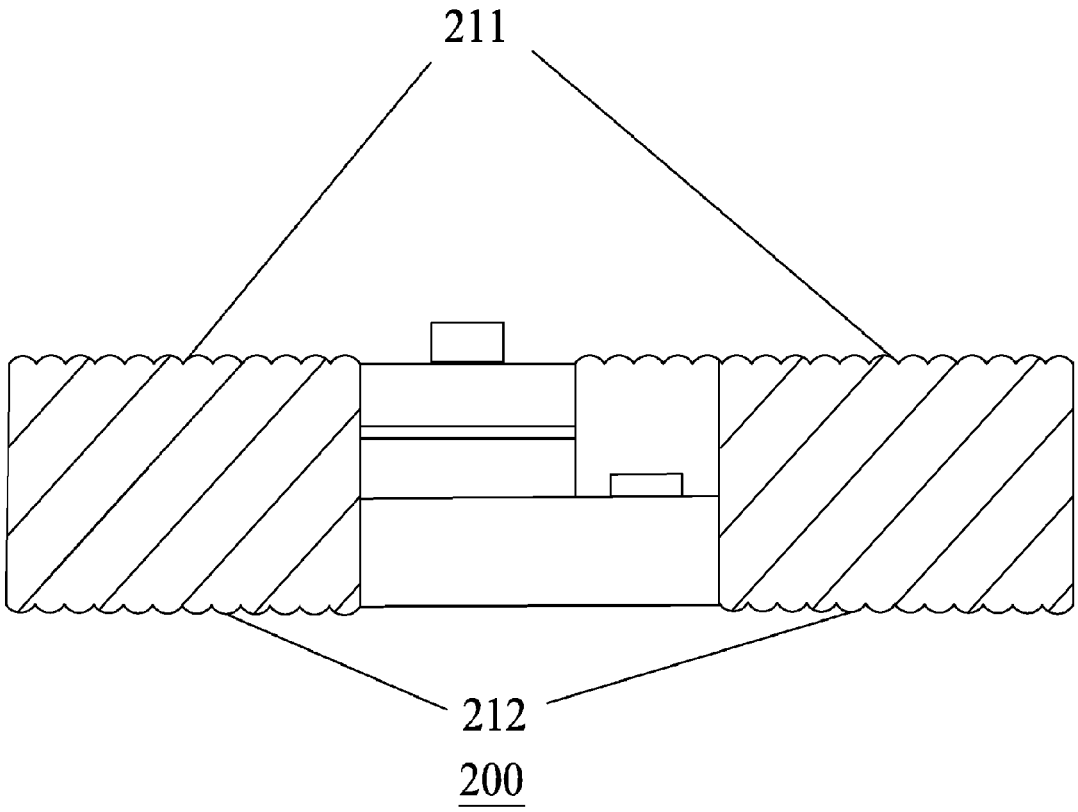
FIG. 2D shows a sectional diagram of the semiconductor light-emitting device in accordance with another embodiment.
Figure 2E:
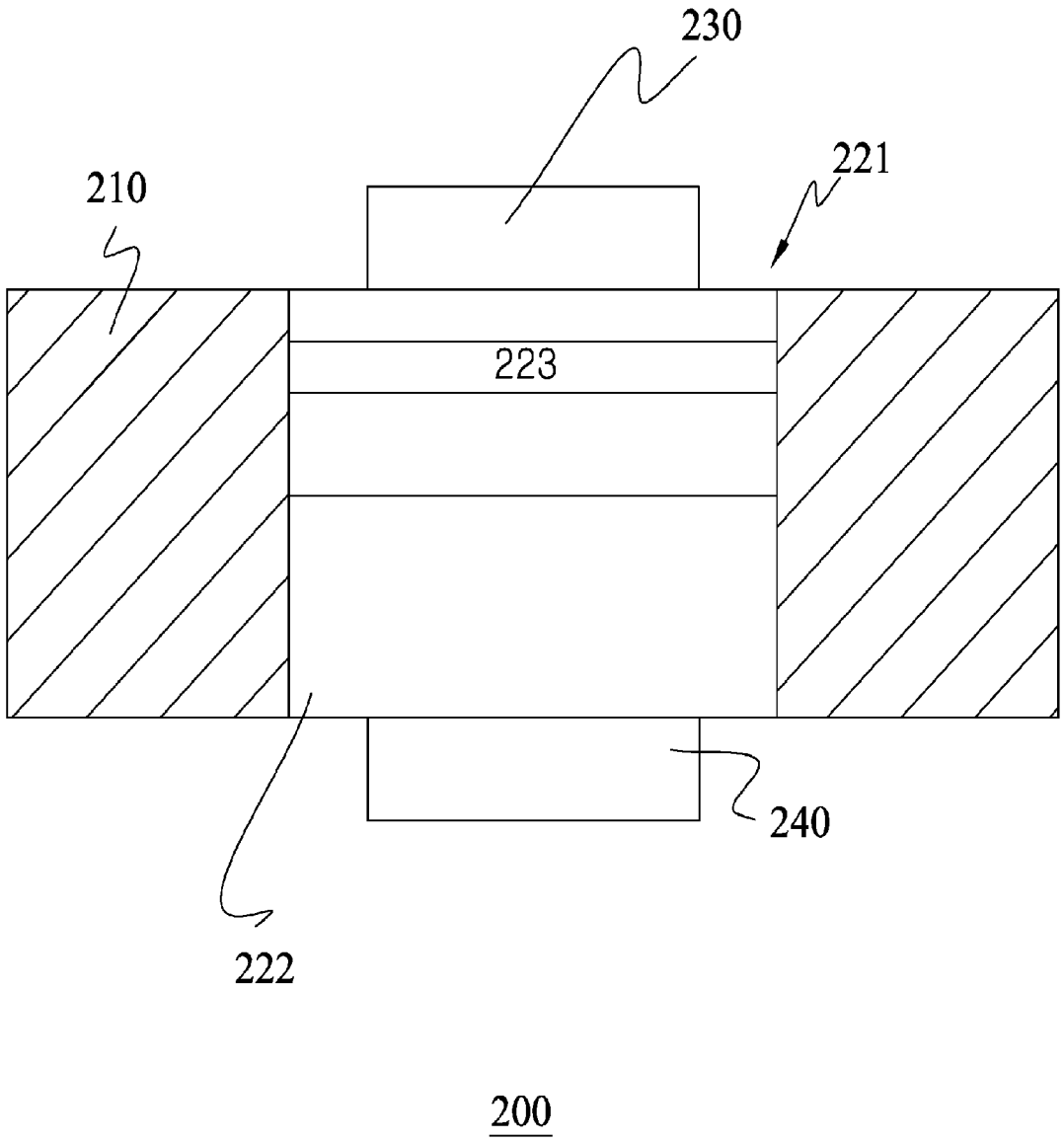
FIG. 2E shows a sectional diagram of the semiconductor light-emitting device in accordance with another embodiment.

In this embodiment, a first surface 211 and a second surface 212 of the external optical element 210 are flat. However, when the light emits to the interface between the external optical element 210 and the environment air, a problem of total reflection might occur because of the difference of the refractive indices thereof. If the interface is rough or uneven, the light can be scattered on this interface to reduce the chance of the total reflection, and the light extraction efficiency increases accordingly. Referring to FIG. 2D, rough surfaces or uneven surfaces are formed on the first surface 211 and the second surface 212 to increase the light extraction efficiency, preferably. The rough surface or the uneven surface can be regular or irregular pattern such as Fresnel surface, depending on purposes. The electrodes or pads of the embodiments mentioned above are on the same side of the light-emitting structure. However, FIG. 2E shows that the electrodes or pads are unrestricted to locate on the same side of the light-emitting structure.

In another embodiment, the transparent substrate 222 includes a top surface and a bottom surface having different areas from each other to form some special shapes such as inverted-trapezoid, trapezoid, or frustum. To increase the light extraction efficiency, the external optical element 210 can be one of the shapes mentioned above or the combination thereof.

Figure 3A:
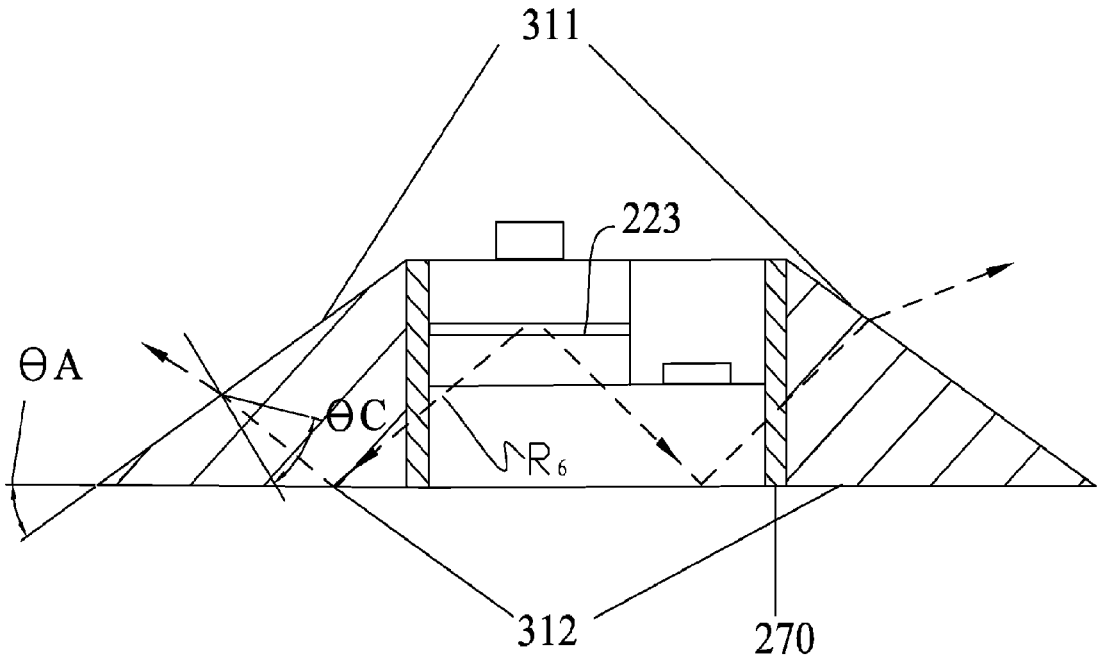
FIGS. 3A~3F show a sectional diagram of the semiconductor light-emitting device in accordance with another embodiment.
Figure 3B:
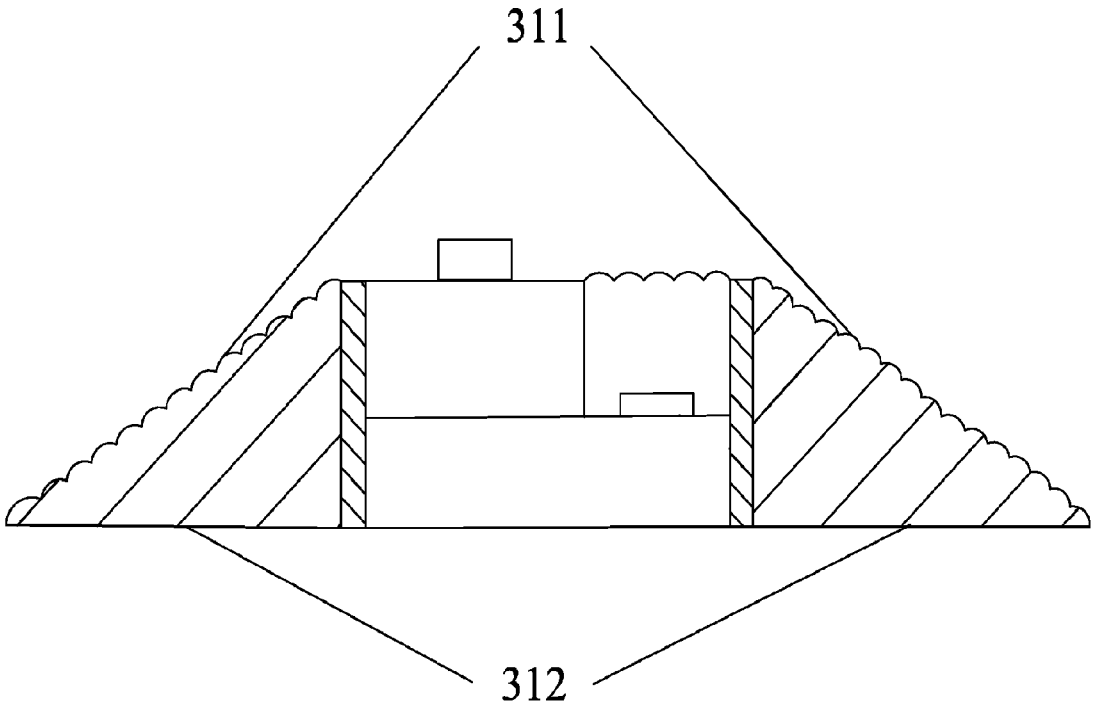
Figure 3C:
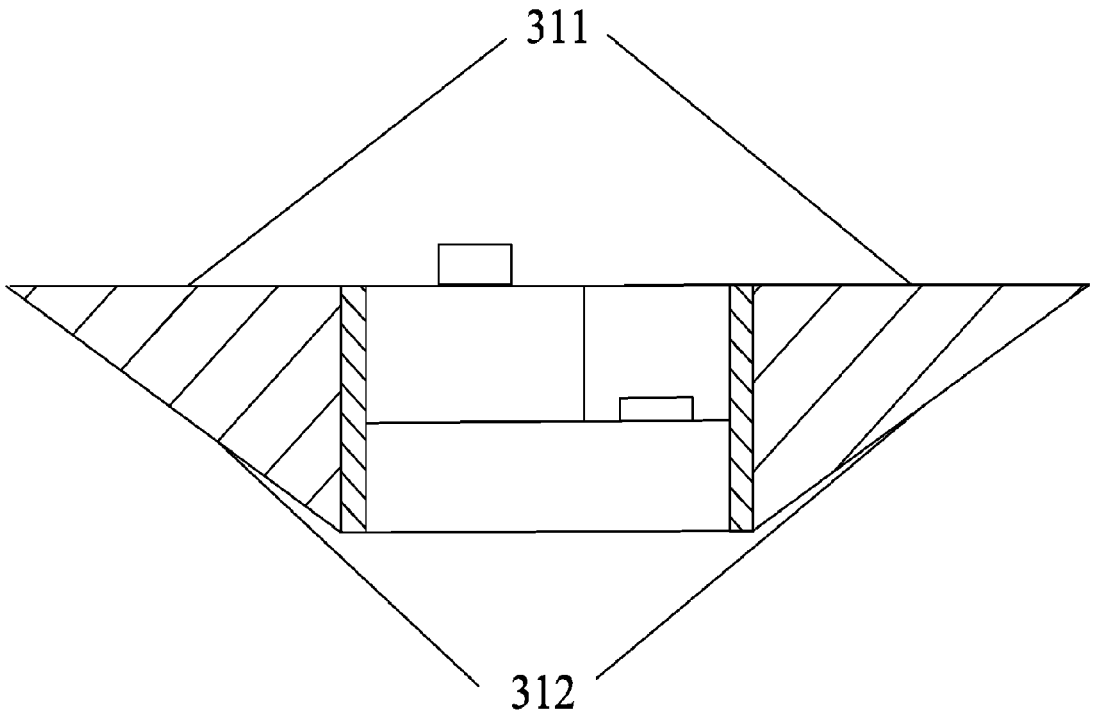
Figure 3D:
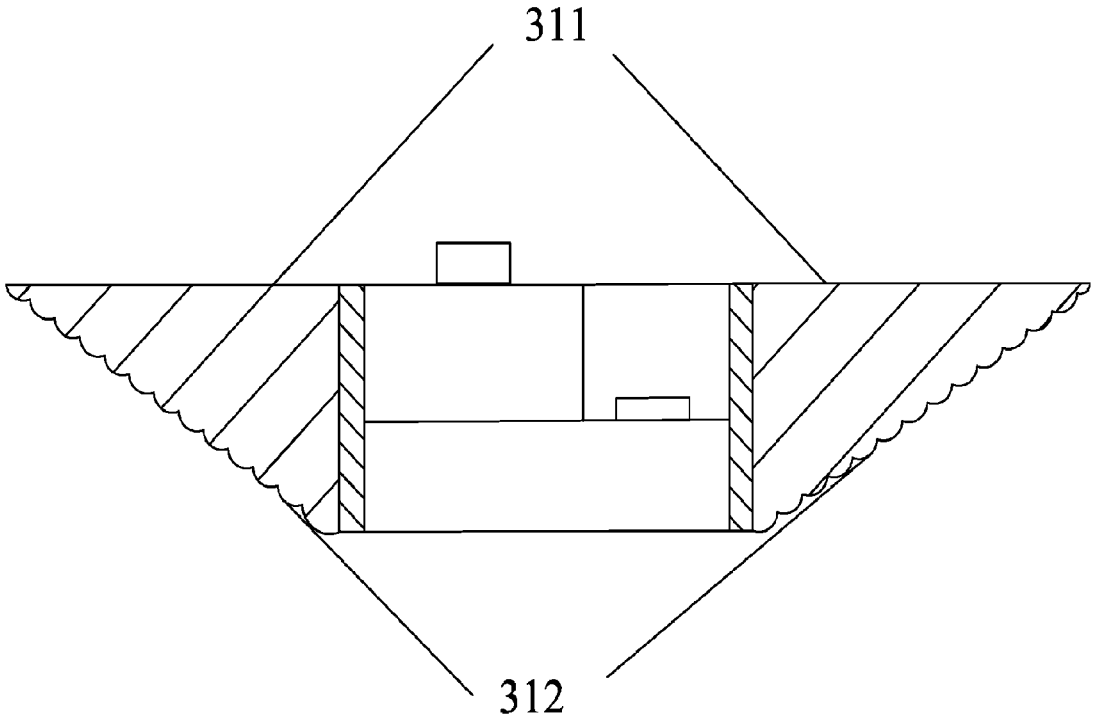
Figure 3E:
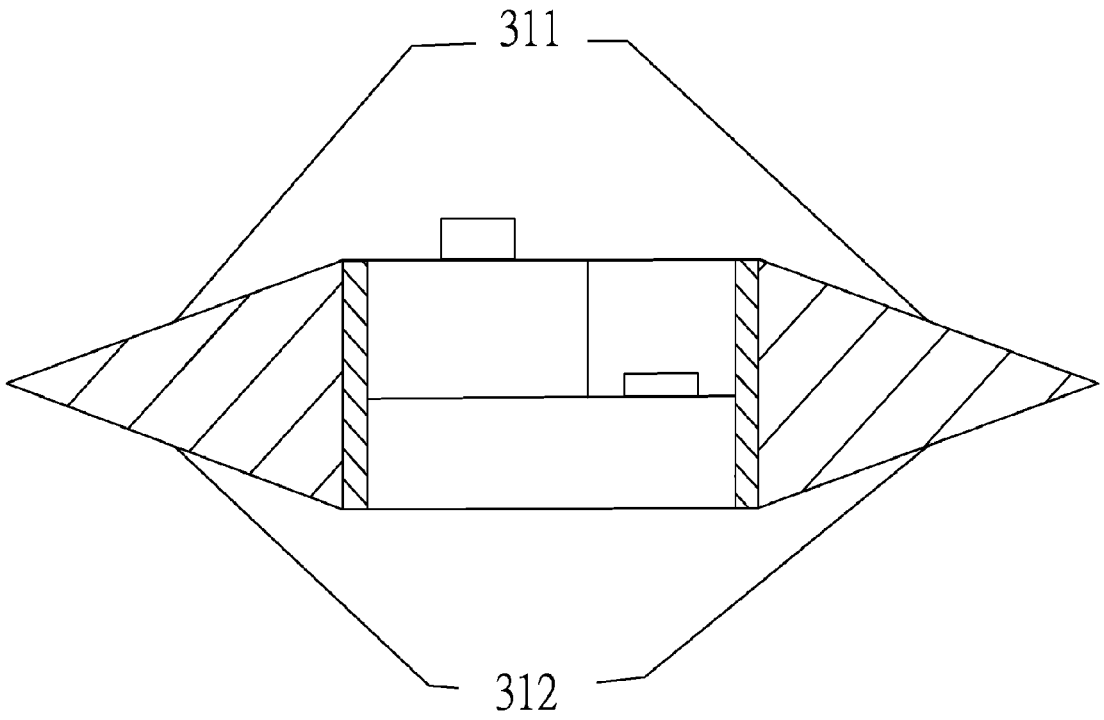
Figure 3F:
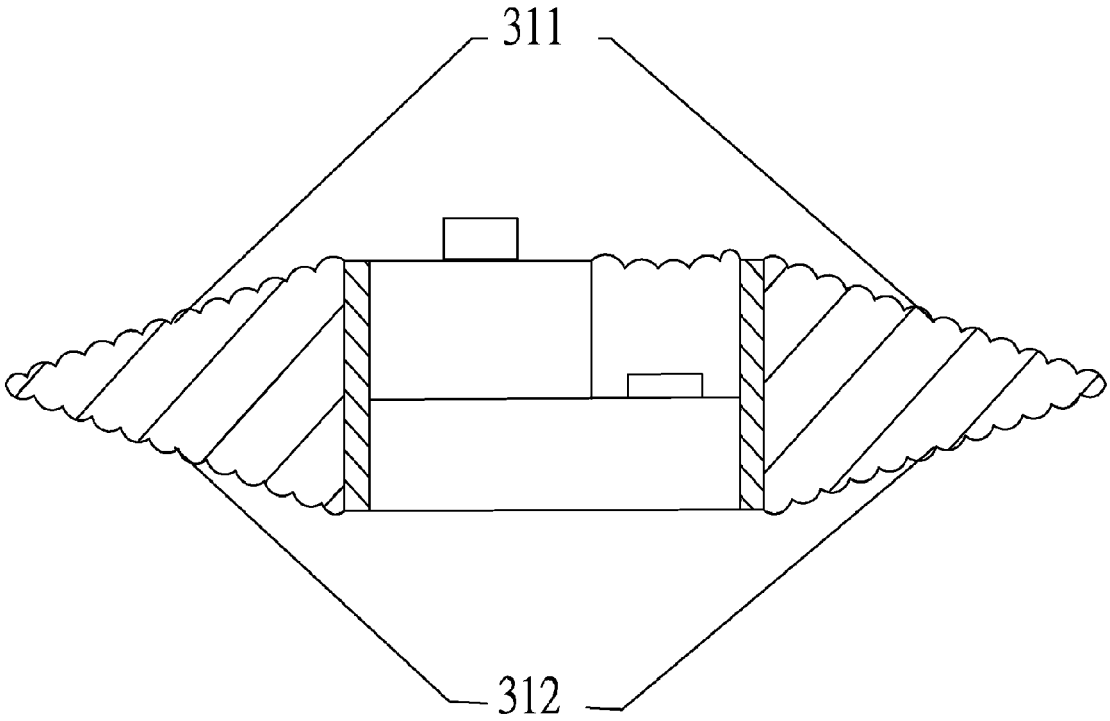

Referring to FIG. 3A, a first surface 311 inclined an angle $\theta_I$ relative to a second surface 312 so a sixth ray enters the range of the critical angle $\theta_C$ more easily. In addition, referring to FIGS. 3B-3F, the second surface 312 is a ramp, or the first surface 311 and the second surface 312 are both the ramps. To increase the light extraction efficiency, the first surface 311 and the second surface 312 can be the rough surfaces or uneven surfaces, too. Moreover, the external optical element 210 can surround the periphery of the light-emitting structure 220 or connect to at least one side thereof.

If the external optical element 210 is sapphire, a method of manufacturing the embodiments mentioned above includes forming a through hole slightly larger than the transparent substrate 222 in the center of the external optical element 210 by laser, and connecting the light-emitting structure 220 to the external optical element 210 by glue bonding. The glue layer 270 is transparent relative to the light from the transparent substrate 222, and the refractive index thereof $n_b$ is about the same as that of the transparent substrate 222 $n_s$ or in-between that of the transparent substrate 222 $n_s$ and the encapsulant $n_o$.

The material of the transparent substrate 222 can be conductive or insulated, for example, SiC, GaP, GaAsP, sapphire, or ZnSe. The glue layer 270 for the glue bonding includes but unrestricted to SOG, silicone, BCB, epoxy, polyimide, PFCB, Su8, resin, or the combination thereof. The material of the external optical element 210 includes but unrestricted to SiC, GaP, CVD diamond, diamond, resin, $ZrO_2$, spinel, AlON, or sapphire, wherein the resin is Su8 preferably.

If the external optical element 210 is resin, it can surround the lateral wall of the light-emitting structure 220 directly. Alternatively, the light-emitting structure 220 is inserted into a resin layer, and the extra resin layer on the bottom of the light-emitting structure 220 is then removed. In another embodiment, a plurality of holes can be formed in the semiconductor stack above the growth substrate and the resin layers are formed in the plurality of holes. The semiconductor stack 221 and the growth substrate are cut from the holes and then the growth substrate is removed to form the LED chips. Thus, the external optical element 210 surrounding the light-emitting structure 220 is formed. However, if the growth substrate is transparent, it can be kept to cooperate with the external optical element 210 surrounding the periphery of the light-emitting structure 220 to increase the probability for the light to leave the chip. Moreover, the external optical element 210 can also surround the periphery of the semiconductor stack 221 and the growth substrate. Furthermore, by the method mentioned above, the resin layers having different refractive indices can be formed in the hole to reduce the total reflection and increase the probability for light to leave the chips. Preferably, the refractive index of the resin is larger than or about the same as that of the transparent substrate 222 or in-between that of the transparent substrate 222 and the encapsulant. Ideally, when $n_s \leq n_b \leq n_o$ or $n_s \leq n_o$, there is no total reflection occurred inside the above-mentioned structure, especially when $n_s \leq n_b \leq n_o$ or $n_s \leq n_o$. In another aspect, when $n_o$ is slightly less than $n_s$ and $n_o$ is slightly larger than $n_e$, the light extraction efficiency can be increased. When $n_o$ is slightly less than or equal to $n_s$ and $n_b$ is slightly larger than or equal to $n_e$, but $n_o$ is slightly larger than $n_e$, the probability of the light emitting out via the external optical element 210 is increased as well. Similarly, when $n_b$ is slightly less than or equal to $n_o$ and $n_o$ is slightly less than or equal to $n_s$, but $n_b$ is slightly larger than $n_e$ and the thickness of the glue is quite thin, the light extraction efficiency also can be increased.

Figure 4A:
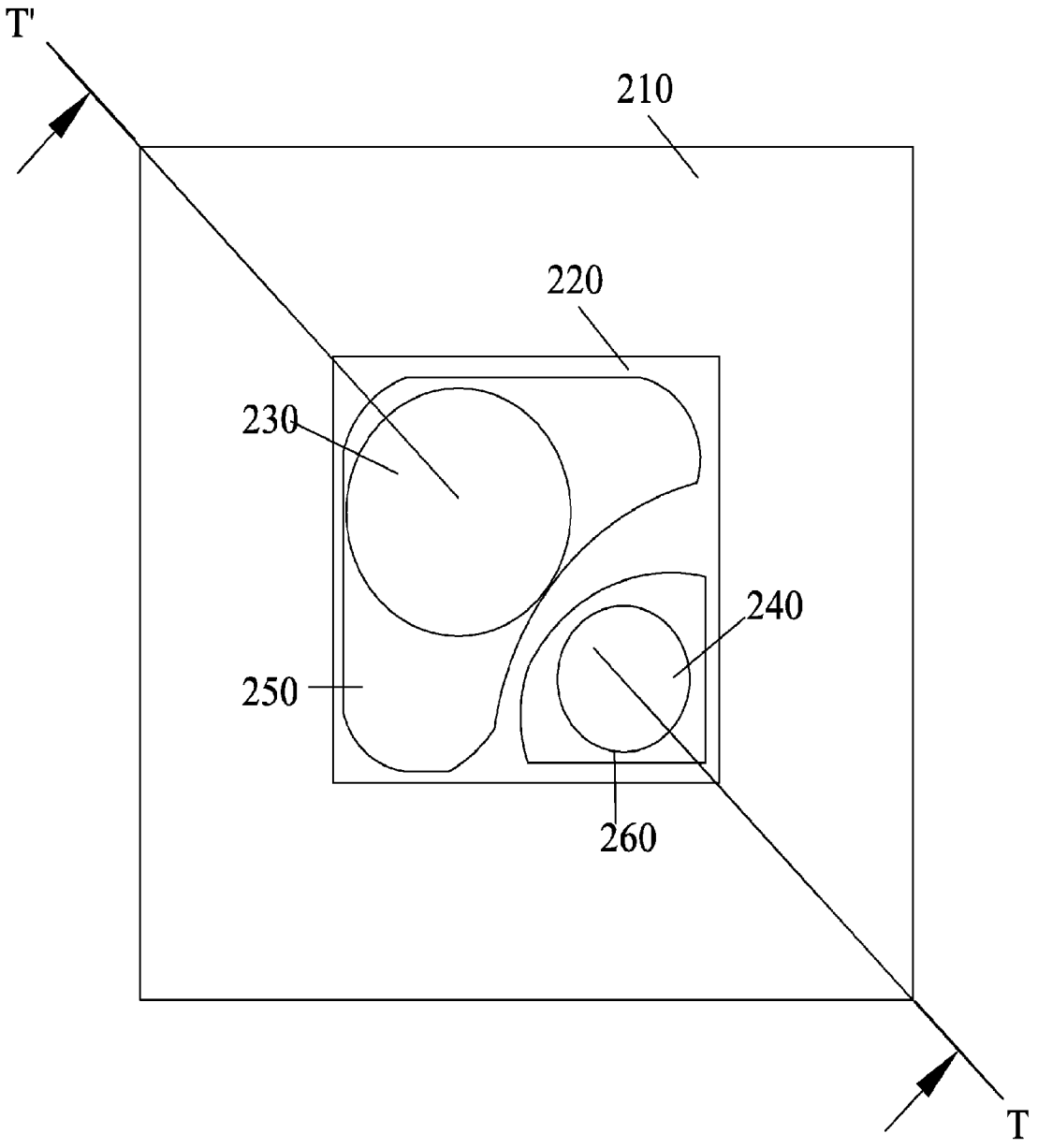
FIG. 4A shows a schematic diagram of a semiconductor light-emitting device in accordance with an embodiment.
Figure 4B:
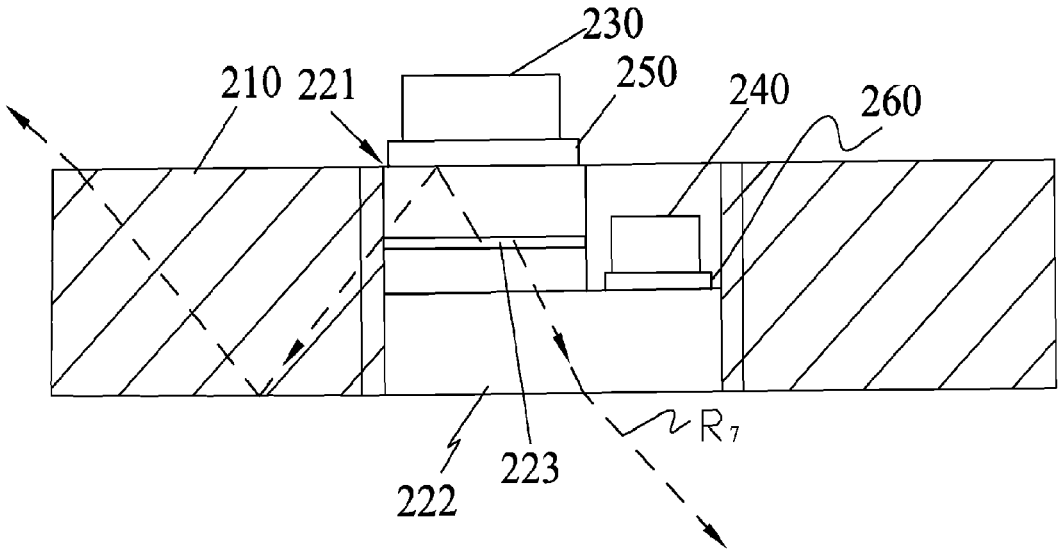
FIG. 4B shows a sectional diagram of the semiconductor light-emitting device of FIG. 4A.

In another aspect, as the market demand and the cost are concerned, the dimension of the LED chip is minified gradually. However, the dimension of the pad is hardly changed. Therefore, the ratio of the surface area of the light-emitting structure 220 covered by the pad increases. Since the pad is light-impermissible, the light will be blocked by the pads and is not able to leave the chip. Referring to FIG. 4A, this structure is suitable to an LED chip of which over 50% of the surface area of the light-emitting structure 220 is covered by a p-type pad 230 and an n-type pad 240. Referring to FIG. 4B, the p-type pad 230 and the n-type pad 240 include a first reflective layer 250 and a second reflective layer 260 located on the bottom thereof to reflect a seventh ray R7 emitting to the pads to the transparent substrate 222 or the external optical element 210, so the probability of the pads absorption is decreased and the light extraction efficiency is increased. With the same concept, this embodiment is also suitable to the pads that are light-impermissible electrodes or other replaceable structures having the same function.

Figure 5A:
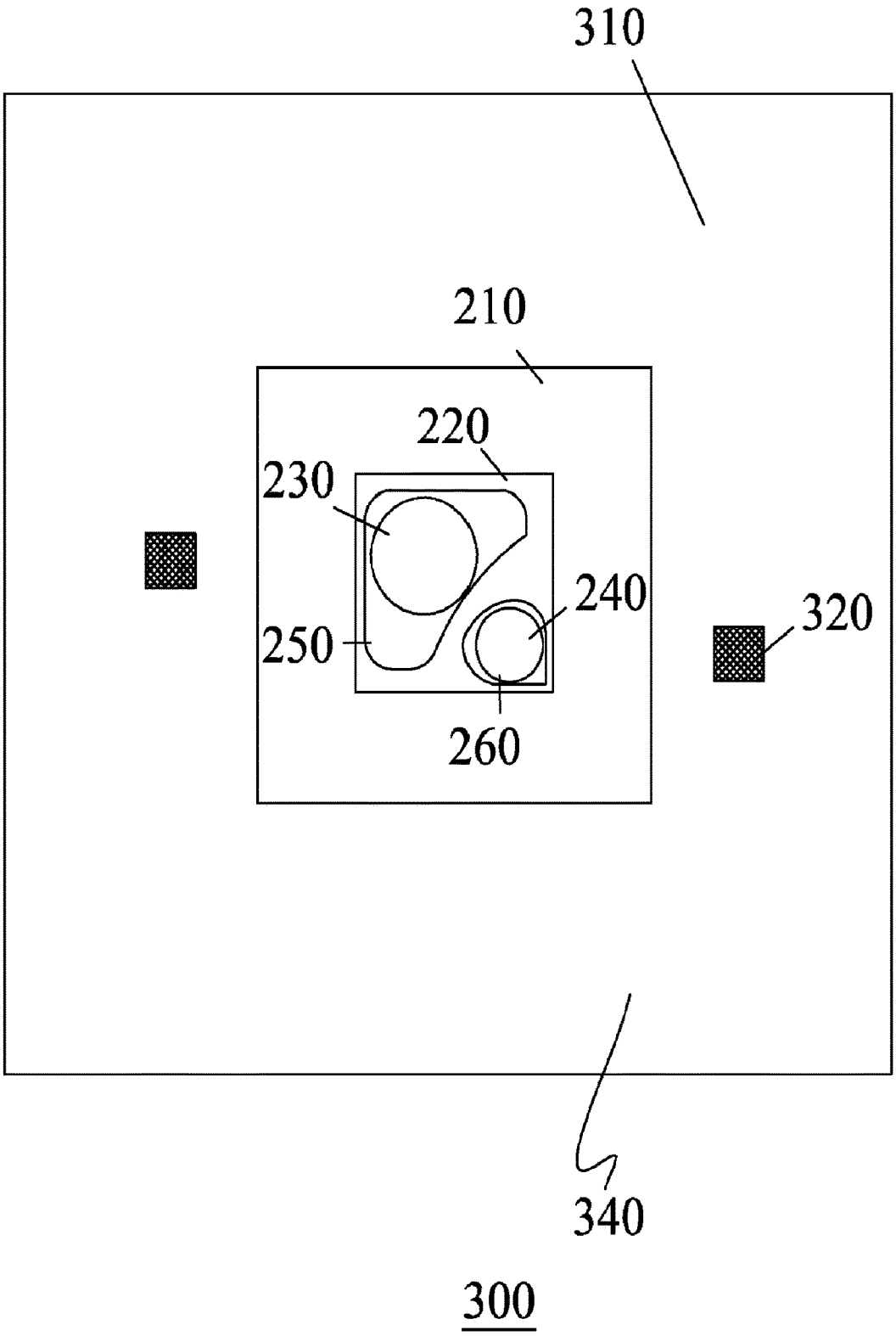
FIG. 5A shows a schematic diagram of an encapsulant structure in accordance with an embodiment.
Figure 5B:
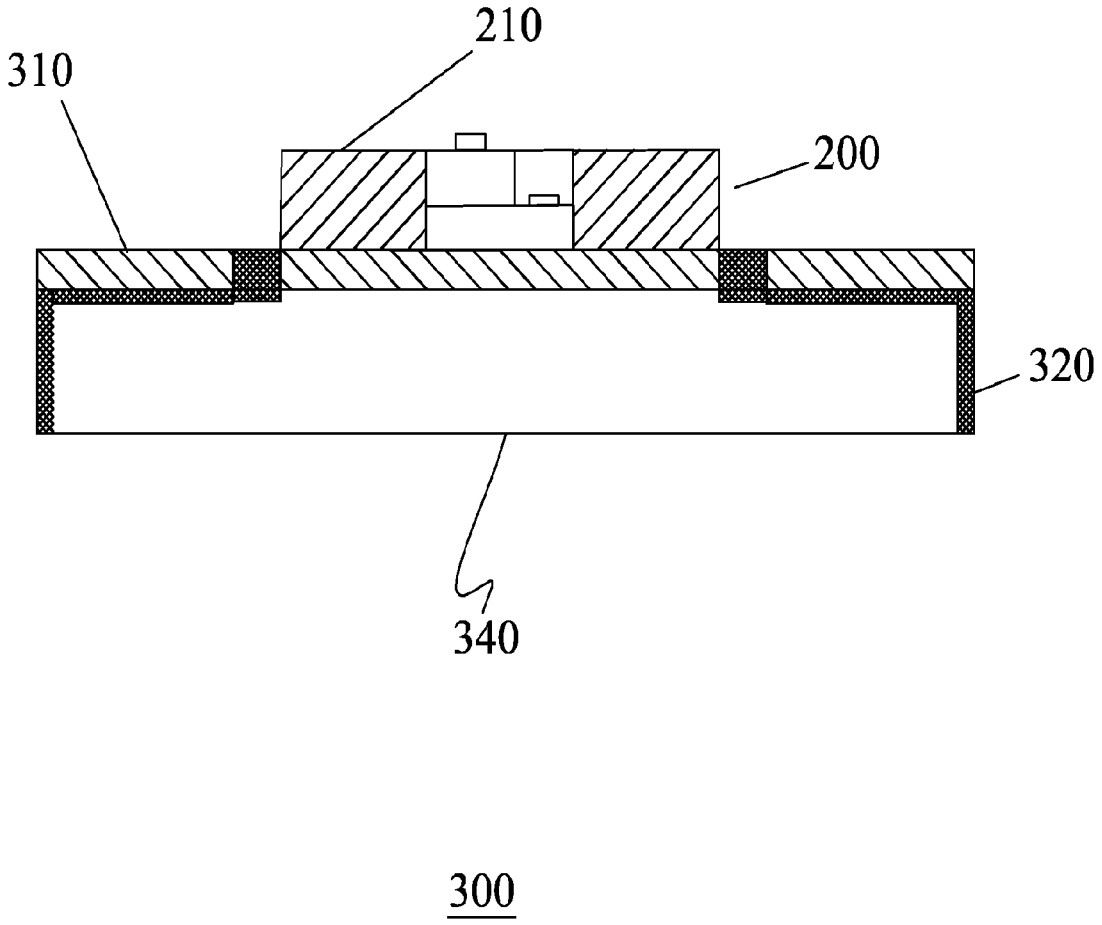
FIG. 5B shows a sectional diagram of the encapsulant structure of FIG. 5A.

The external optical element 210 mentioned above is also suitable to an encapsulant structure. Referring to FIGS. 5A-5B, an encapsulant structure 300, especially for the light-emitting structure 200, at least includes a submount 340 and the external optical element 210. The external optical element 210 is located on the submount 340 and the submount 340 can include at least a lead 320 optionally. A third reflective layer 310 or a Lambertian Surface can be formed for reflection under the external optical element 210 optionally. Then, an encapsulant material covers the encapsulant structure 300 mentioned above. A wavelength-converted material can be included in the optical element 210 or the encapsulant material (not shown here), or cover the LED chip for converting the original color light thereof. The wavelength-converted material can be phosphor, organic semiconductor, II-VI group or III-V group of the semiconductor, nanometer crystal, dye-stuff, or polymer. During the encapsulating process, the external optical element 210 can be set on the submount 340 and then connected to the light-emitting structure 220. Thus, the commercial LED chips available in the market can be applied to the light-emitting device as shown in abovementioned embodiments.

The materials of the first reflective layer 250, the second reflective layer 260, and the third reflective layer 310 include metal, oxide, the combination thereof, or other reflective materials. Preferably, they include but unrestricted to In, Sn, Al, Au, Pt, Zn, Ag, Ti, Pb, Ge, Cu, Ni, AuBe, AuGe, AuZn, PbSn, $SiN_x$, $SiO_2$, $Al_2O_3$, $TiO_2$, or MgO.

Figure 6A:
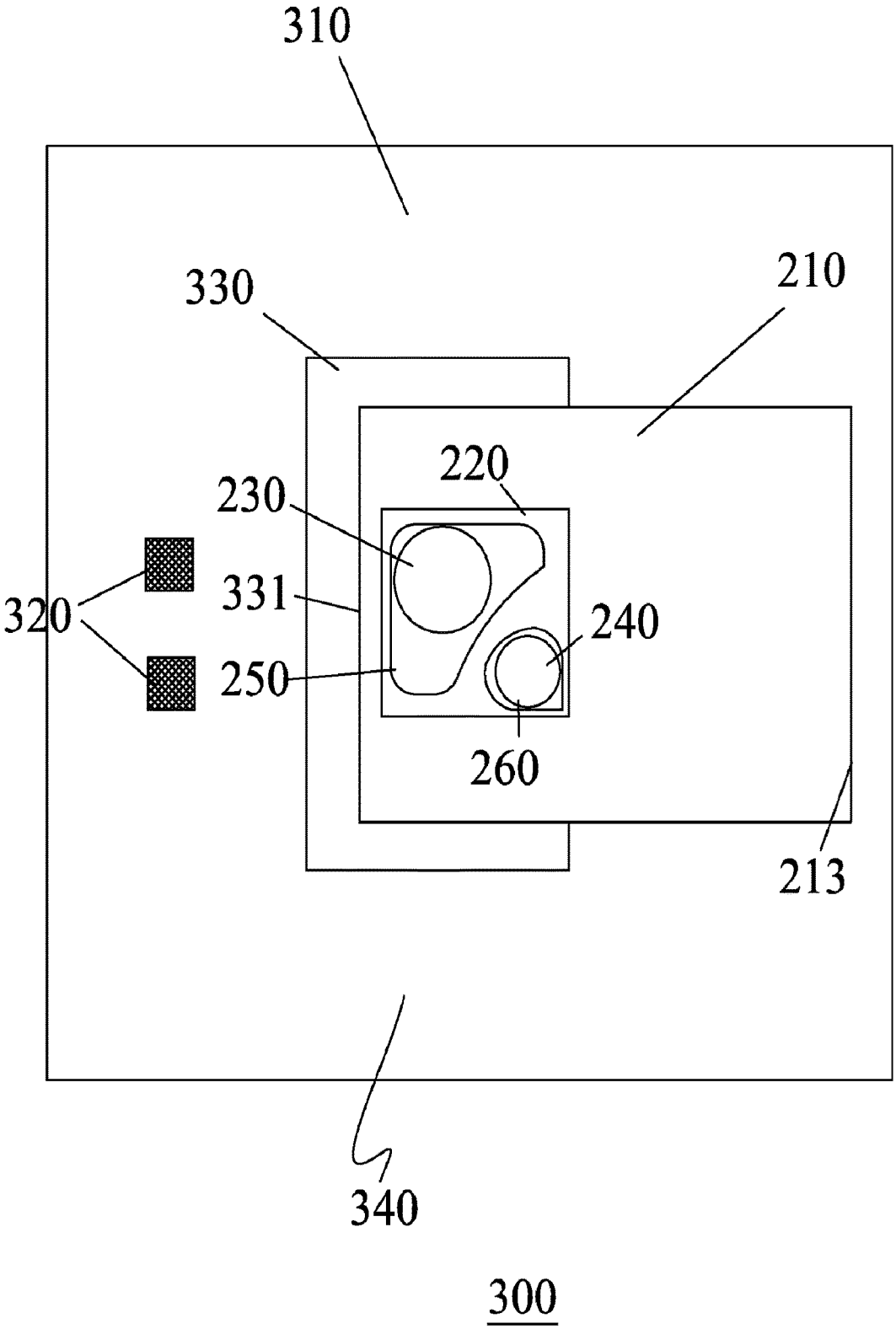
FIG. 6A shows a schematic diagram of an encapsulant structure in accordance with another embodiment.
Figure 6B:
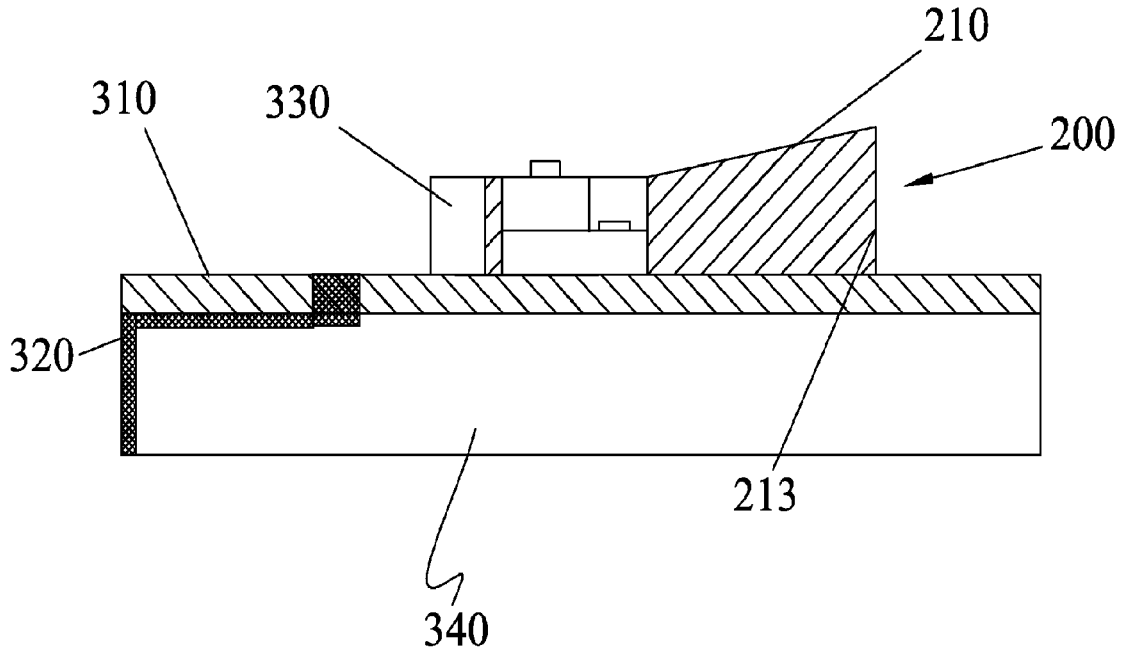
FIG. 6B shows a sectional diagram of the encapsulant structure of FIG. 6A.
Figure 6C:
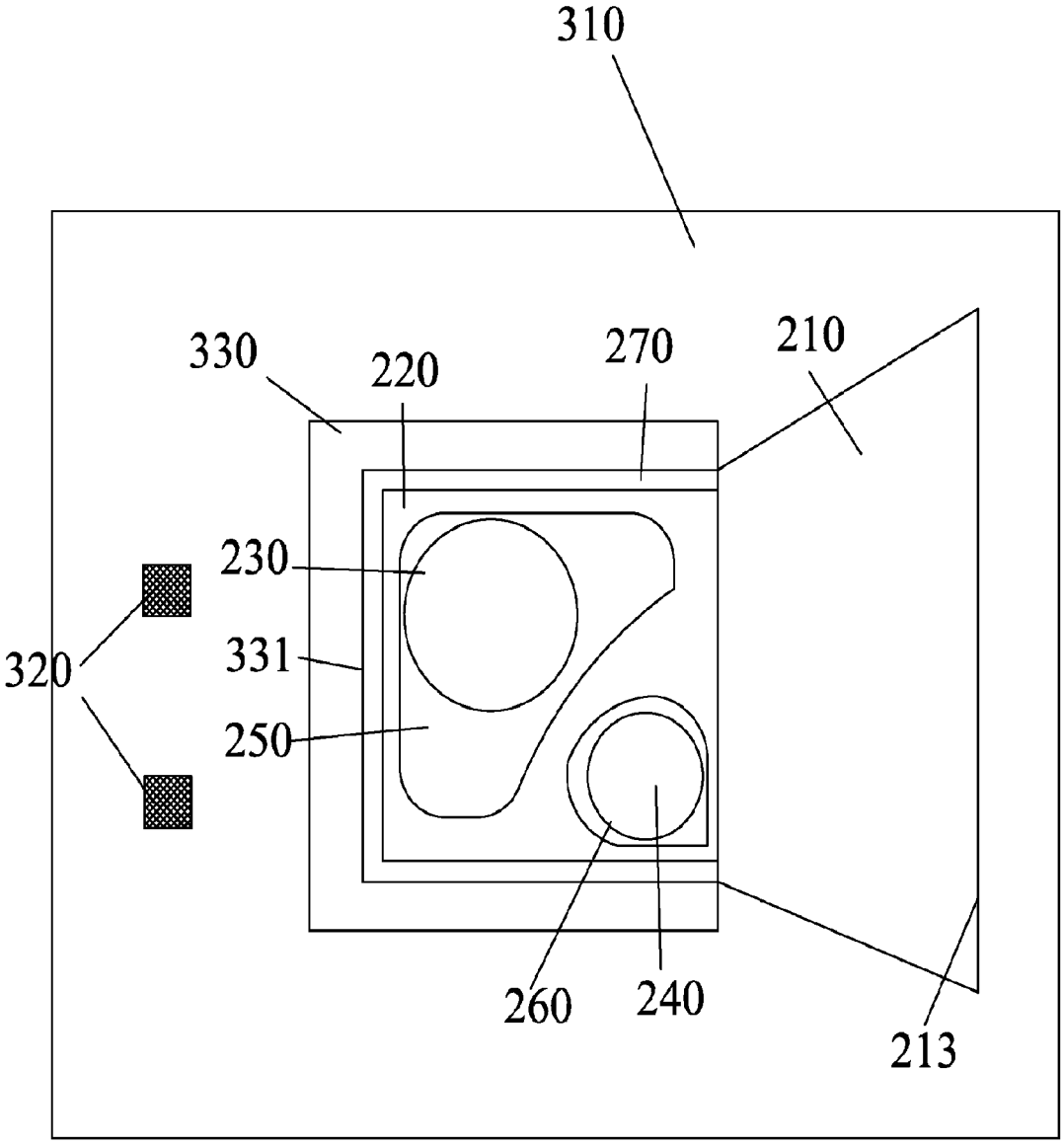
FIG. 6C shows a schematic diagram of an encapsulant structure in accordance with another embodiment.
Figure 6D:
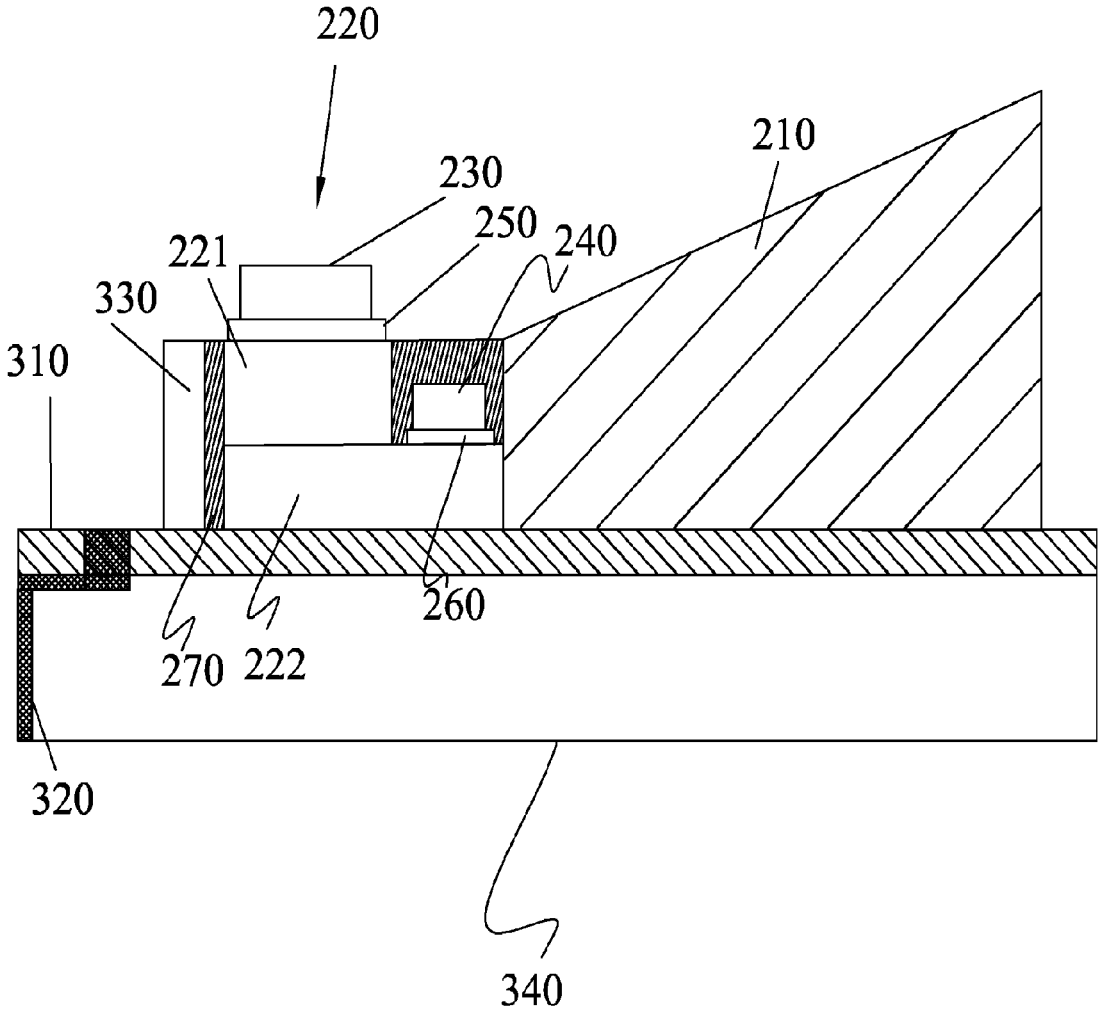
FIG. 6D shows a sectional diagram of the encapsulant structure of FIG. 6C.

Referring to FIGS. 6A-6B, a reflective structure 330 is equipped with the external optical element 210 of the abovementioned encapsulant structure 300. The reflective structure 330 includes an inner wall 331 which can reflect the light emitting to the reflective structure 330. The light emitting upwards is reflected by the first reflective layer 250 and the second reflective layer 260 under the p-type pad 230 and the n-type pad 240. The light emitting downwards hits the reflective layer 310 and then is also reflected. Consequently, the light returns to the third surface 213 and leaves there. Referring to FIGS. 6C-6D, the lateral surfaces of the transparent substrate 222 and the semiconductor stack 221 are connected to the inner wall 331 of the reflective structure 330 by the glue layer 270. Other surfaces of the transparent substrate 222 and the semiconductor stack 221 disconnected to the inner wall 331 are connected to the external optical element 210. When $n_b \ll n_s$, the total reflection can be formed on the interface of the transparent substrate 222 and the glue layer 270. Thus, the light from the light-emitting structure 220 all emits out via the external optical element 210. Moreover, when $n_o > n_e$, the light extraction efficiency increases. In other words, this structure can control the direction of the light leaving the light-emitting structure 220. This disclosure can be modified or changed under this inventive spirit.

The inner wall 311 of the reflective structure 330 includes a reflective layer such as a DBR or a Lambertian Surface for reflecting the light emitting to the reflective structure 330. The material of the reflective structure 330 includes metal, oxide, the combination thereof, or other reflective material. Preferably, it includes but unrestricted to In, Sn, Al, Au, Pt, Zn, Ag, Ti, Pb, Ge, Cu, Ni, AuBe, AuGe, AuZn, PbSn, $SiN_x$, $SiO_2$, $Al_2O_3$, $TiO_2$, or MgO.

This disclosure qualifies the characteristics of high brightness, low power consumption, thinness, and lightness and is applicable to BLU. In addition, this disclosure is also applicable to all kinds of the displays to become the main component.

It should be noted that the proposed various embodiments are not for the purpose to limit the scope of the invention. Any possible modifications without departing from the spirit of the invention are covered by the appended claims.

What is claimed is:

1. A semiconductor device, comprising:

a light-emitting structure having [side surfaces,] a top surface[,] and a bottom surface;

an optical element [optically coupled to one of the side surfaces, and exposing the top surface,] *surrounding the light-emitting structure, and exposing the top surface or* the bottom surface[, or both thereof];

[a metal] *an insulated reflective* layer under the bottom surface; and a first lead penetrating *through and directly connected to* the [metal] *insulated reflective* layer.

2. The semiconductor device of claim 1, wherein the first lead has [one end near the light-emitting structure] *a first end exposed to a top surface of the insulated reflective layer* and [another one] *a second* end [distant from the light-emitting structure] *located under the insulated reflective layer*.

[3. The semiconductor device of claim 1, wherein the optical element surrounds the side surfaces of the light-emitting structure.]

4. The semiconductor device of claim 1, further comprising a [second lead; wherein the first lead and the second lead are arranged on one or two sides of the side surfaces] *reflective layer formed on the top surface*.

[5. The semiconductor device of claim 1, further comprising two pads formed on the same side of the light-emitting structure.]

6. The semiconductor device of claim 1, further comprising two pads formed on [a diagonal] *the top surface* of the light-emitting structure, *wherein the two pads are formed on a diagonal of the light-emitting structure in a top view*.

7. The semiconductor device of claim 1, further comprising a heat dissipation material under the light-emitting structure.

8. A semiconductor device, comprising:

a light-emitting structure having [outer surfaces] *a top surface*;

an optical element [optically coupled to one or more of the outer surfaces and exposing another one of the outer surfaces] *surrounding the light-emitting structure*;

[a metal] *an insulated reflective* layer under the light-emitting structure; and a first lead being far from the light-emitting structure [and], penetrating *through* the [metal] *insulated reflective* layer, *and directly connected to the insulated reflective layer*.

9. The semiconductor device of claim 8, wherein the first lead has a first end [near the light-emitting structure] *exposed to a top surface of the insulated reflective layer* and a second end [distant from the light-emitting structure] *located under the insulated reflective layer*.

10. The semiconductor device of claim 8, further comprising a second lead;

wherein the first lead and the second lead are arranged on one or two sides of the light-emitting structure.

[11. The semiconductor device of claim 8, further comprising two pads formed on the same side of the light-emitting structure.]

12. The semiconductor device of claim 8, further comprising two pads formed on *the top surface, wherein the two pads are formed on* a diagonal of the light-emitting structure *in a top view*.

13. The semiconductor device of claim 8, further comprising a submount under the [metal] *insulated reflective* layer.

14. The semiconductor device of claim 8, further comprising a heat dissipation material under the light-emitting structure.

15. The semiconductor device of claim 8, further comprising a reflective [structure formed on one or more of the outer surfaces which are not coupled to the optical element] *layer formed on the top surface*.

16. A semiconductor device, comprising:

a light-emitting structure having [outer surfaces] *a first top surface*;

an optical element [optically coupled to one or more of the outer surfaces and exposing another one of the outer surfaces] *surrounding the light-emitting structure*;

[a metal] *an insulated reflective* layer under the light-emitting structure *and having a second top surface*;

a submount under the [metal] *insulated reflective* layer; and a lead having a first end [and], a second end *and a surface directly connected to the insulated reflective layer*, and [passing] *penetrating* through the [metal] *insulated reflective* layer and the submount to expose the first end *to the second top surface* and the second end *under the insulated reflective layer*.

17. The semiconductor device of claim 16, wherein the first end [is near the light-emitting structure] and the second end [is distant from the light-emitting structure] *have different widths in a cross-sectional view*.

18. The semiconductor device of claim 16, [wherein the lead penetrates the metal layer] *further comprising a reflective structure formed between the first end and the light-emitting structure*.

19. The semiconductor device of claim 16, further comprising a heat dissipation material under the light-emitting structure.

20. The semiconductor device of claim 16, further comprising a reflective [structure formed on one or more of the outer surfaces not coupled to the optical element] *layer formed on the first top surface*.

*21. The semiconductor device of claim 1, wherein the first lead comprises a portion extending in a direction away from the light-emitting structure, under the insulated reflective layer.*

*22. The semiconductor device of claim 8, wherein the first lead comprises a portion under the insulated reflective layer.*

* * * * *